United States Patent [19]

Takemori

[11] Patent Number: 5,617,232

[45] Date of Patent: Apr. 1, 1997

[54] OPTICAL DIGITAL HOLDING APPARATUS

[75] Inventor: Tamiki Takemori, Hamamatsu, Japan

[73] Assignee: Hamamatsu Photonics K.K., Hamamatsu, Japan

[21] Appl. No.: 217,652

[22] Filed: Mar. 25, 1994

[30] Foreign Application Priority Data

Mar. 26, 1993 [JP] Japan .................................. 5-068687

[51] Int. Cl.$^6$ ............................................ G02F 3/00
[52] U.S. Cl. ................................ 359/108; 359/107
[58] Field of Search ........................... 359/107, 108

[56] References Cited

U.S. PATENT DOCUMENTS

| | | | |
|---|---|---|---|
| 4,521,681 | 6/1985 | Inaba et al. | 250/205 |
| 4,675,518 | 6/1987 | Oimura et al. | 250/205 |
| 4,964,687 | 10/1990 | Falk | 359/107 |
| 4,978,842 | 12/1990 | Hinton et al. | 250/213 A |
| 5,442,471 | 8/1995 | Takemori et al. | 359/108 |
| 5,528,702 | 6/1996 | Mitsuoka et al. | 382/211 |

FOREIGN PATENT DOCUMENTS

| | | | |
|---|---|---|---|
| 0223015 | 12/1984 | Japan | 359/107 |
| 0245231 | 9/1989 | Japan | 359/107 |
| 0288832 | 11/1989 | Japan | 359/107 |
| 0097922 | 4/1990 | Japan | 359/108 |
| 0220037 | 9/1990 | Japan | 359/108 |
| 1603334 | 10/1990 | U.S.S.R. | 359/108 |
| 1833899 | 8/1993 | U.S.S.R. | 359/107 |

OTHER PUBLICATIONS

Jun Tanida, et al., "OPALS: Optical Parallel Array Logic System", *Applied Optics* vol. 25, No. 10, 15 May 1986, pp. 1565–1570.

A.D. McAulay, *Optical Computer Architectures*, Wiley & Sons, New York, 1991, Section 8.3.1.

K.H. Brenner, "Digital Optical Computing," *Appl. Phys. B. / Photophysics & Laser Chemistry*, vol. B46, No. 2, Heidelberg, DE, Jun. 1988, pp. 111–120.

M. Hashimoto, et al., "Sequential Logic Operations Using Optical Parallel Processor Based Upon Polarization Encoding", *Optical Comp. & Proc.* vol. 1, No. 4, Dec. 1991, London pp. 303–313.

Jamal U. Ahmed, et al., "Polarization–Encoded Optical Shadow Casting: Arithmetic Logic Unit(ALU) Design Using Truth Table Partioning", *Optics Communications*, vol. 90, No. 1, Amsterdam, NL, 1 Jun. 1991, pp. 156–164.

H. Schneider, et al, "Electro–Optic Multistability in GaAs/AlAs Superlattices At Room Temperature", *Appl. Phys. Lett.*, vol. 56, No. 7, 12 Feb. 1990, pp. 605–607.

C. C. Guest, et al., "Exclusive or Processing (Binary Image Subtraction) Using Thick Fourier Holograms" *Applied Optics*, vol. 23, No. 19, 1 Oct. 1984, pp. 3444–3454.

(List continued on next page.)

*Primary Examiner*—Paul M. Dzierzynski
*Assistant Examiner*—John Juba, Jr.
*Attorney, Agent, or Firm*—Cushman Darby & Cushman, IP Group of Pillsbury Madison & Sutro, LLP

[57] ABSTRACT

An optical digital holding apparatus of the present invention carries out functions of a flip-flop apparatus (RS flip-flop, D flip-flop etc.) which are one kind of electrical digital holding apparatus, and can be achieved by placing optical connecting wiring having a direct or indirect feedback circuit between multistage optical selectors having selector functions. The optical digital holding apparatus of the present invention includes multistage selectors which receive an aggregation of spatially distributed optical digital information signals propagating in a predetermined direction and bearing binary digital information and an optical control signal bearing binary digital information. These selectors selectively output a portion of an aggregation of the digital information signals received in accordance with a value of the digital information carried by the optical control signal. The optical digital holding apparatus also includes optical connection wiring for connecting an output optical signal of one of the selectors to an input optical signal of one of the other selectors.

22 Claims, 7 Drawing Sheets

OTHER PUBLICATIONS

Patent Abstracts Of Japan, vol. 9, No. 197 (E–335) [1920], Aug. 14, 1985 & JP–A–60 064521 (Matsushita Denki Sangyo).

Patent Abstracts Of Japan, vol. 14, No. 542 (P–1137), Nov. 30, 1990 & JP–A–02 230224 (Nippon Telegr & Teleph Corp) Sep. 12, 1990.

Anacker et al, "Beam–Operated Memory Cells", IBM Technical Disclosure Bulletin, vol. 9, No. 6, Nov. 1966, Armonk, US, pp. 737–738.

OPTICAL DIGITAL HOLDING APPARATUS

BACKGROUND OF THE INVENTION

1. Field of the Invention

The present invention relates to an optical digital holding apparatus for holding instantaneous digital information borne by an optical signal.

2. Related Background Art

Instead of digital electronic techniques such as electronic computers, a digital optical technique which uses light instead of electrical signals to attain high speed operation has been drawing attention. In the digital optical technique, the current goal is to construct a digital optical computer. Various methods and apparatus have been proposed and tested for optical digital elements which form the basic configuration of the digital optical computer. One of the required optical digital devices for such an optical digital system is an optical digital holding apparatus which holds instantaneous digital information borne by an optical signal.

Conventional optical digital holding apparatuses which have been proposed and tested are as follows.

(1) A first conventional optical digital holding device uses a method in which an intensity of an external light irradiation to the non-linear optical absorptive material in the etalon resonator is varied to control the transmittance thereof having a hysteresis characteristic.

(2) A second conventional optical digital holding device uses a method in which a nonlinear optical absorptive region is formed in an etalon resonator of a laser diode (hereinafter called LD), and is irradiated with the light to enhance the transmittance to generate laser oscillation.

(3) A third conventional optical digital memory device uses a method in which a light transmitted through an electro optical crystal is received and converted into electrons and this electric signal is transmitted so that it is a positive feedback to the electro optical crystal.

(4) A fourth conventional optical digital holding device uses a method in which an output light of an LED or and LD is received in a photo diode (PD), and an output electric signal of the PD is returned.

SUMMARY OF THE INVENTION

It is an object of the present invention to provide an optical digital holding apparatus with simple construction, in which no bias light irradiation or complicated erase operation is required.

An optical digital holding apparatus of the present invention carries out functions of a flip-flop apparatus (RS flip-flop, D-type flip-flop etc.) which is a type of electrical digital holding apparatus, and can be achieved by placing an optical connecting wiring having a direct or indirect feedback circuit which is the essence of the flip-flop circuit between the multistage optical selectors having the selector function.

In other words, the optical digital holding apparatus of the present invention comprises (a) a set of selectors for receiving an aggregation of spatially distributed optical digital information signals propagating in a predetermined direction and bearing binary digital information and an optical control signal bearing binary digital information and selectively outputting one of a portion of an aggregation of the digital information signals which are received in accordance with a value of the digital information borne by the optical control signal, having a delay function and an integration function, placed in multistage, and (b) an optical connection wiring for connecting the selectors to each other, including optical feedback connection for making an output optical signal of one of the selectors into an input optical signal of one of the other selectors and making an output optical signal of one of the other selectors into its input signal or an input signal of a selector in a stage prior to said one of the other selectors.

Here, it is practical that the number of optical digital information signals input to the selection is two and the number of the optical control signals is one. At this time, the selector outputs a third optical information signal bearing the binary digital information borne by either a first optical information signal received in a first area or a second optical information signal received in a second area in accordance with the value of the binary digital information borne by the optical control information.

It is preferable for such a selector to be constructed in one of three ways hereunder in order to attain a high speed response.

A first type of the selector comprises (1) a first variable transmittance (or reflectance) device and a second variable transmittance (or reflectance) device driven independently for controlling either the transmission (or reflection) of an input light or non-transmission (or non-reflection) of the light in accordance with an electric drive manner, (2) a first electric charge injecting device and a first electric charge discharging device, which are connected to the first variable transmittance (or reflectance) device, (3) a second electric charge injecting device and a second electric charge discharging device, which are connected to the second variable transmittance (or reflectance) device, and (4) an optical detection circuit for receiving the optical control signal, issuing an activation direction to either a first pair of the first electric charge injecting device and the second electric charge discharging device or a second pair of the second electric charge injecting device and the first electric charge discharging device, and issuing a deactivation direction to the other pairs in accordance with the value of the binary digital information carried by the optical control signal. Here, it is preferred that the variable transmittance (or reflectance) device is a self-electro-optic effect device and has either quantum confined Stark effect or Wannier-Stark localization effect.

A second type of the selector comprises (1) a first polarization plan rotation device for selectively conducting either non-rotation or 90 degree rotation of a polarization direction of an input linearly polarized light having a predetermined direction of polarization, (2) a place for changing an optical path in accordance with the direction of polarization of the input linearly polarized light received through the first polarization plane rotation device, (3) a second polarization plane rotation device for selectively conducting either the non-rotation or the 90 degree rotation of the direction of polarization of the linearly polarized light output from the double refraction place, (4) a polarization plane rotation controller for setting the first polarization plane rotation device and the second polarization plane rotation device into one of a non-rotation mode and a 90 degrees rotation mode in accordance with the value of the binary digital information carried by the optical control signal, and (5) an output light selector for selecting only the light output from a predetermined area of the second polarization plane rotation device. Here, it is preferable for the first and second polarization plane rotation devices to be twisted nematic liquid crystal cells.

A third type of the selector comprises (1) a variable refractive index device for electrically changing a refractive index, (2) a refractive index controller for receiving the optical control signal and changing a refractive index of the variable refractive index device in accordance with the value of information carried by the optical control signal, and (3) a light selection slit for transmitting only a light output from a specified position of the variable refractive index device. Here, it is preferable for the variable refractive index device to be made of material which is known as electro optical crystal.

In the digital optical holding apparatus, the holding function is achieved by a way such that an output optical signal of the optical selector in a preceding stage is made into an light selection signal or an input optical data signal of the optical selector in a succeeding stage, and an output optical signal of the optical selector in the succeeding stage is made into an input optical data information or an light selection signal of the optical selector itself in the succeeding stage or the optical selector placed in the stage prior to the selector in the succeeding stage.

According to the optical digital holding apparatus of the present invention, the optical selectors capable of being cascade-connected are place in multistage and optically connected to each other, so that the optical digital holding apparatus itself can also be cascade-connected. Further, by combining these with another optical digital processors, a large scale optical digital apparatus such as a counter, a shift register, etc., can be formed.

According to the first type of the optical selector, two variable transmittance devices or variable reflectance devices having the quantum confined Stark effect or the Wannier-Stark localization effect are combined and driving transistors are prepared for the injection/discharge of the electric charges of the devices controlling the transmission/non-transmission of the light in the respective devices such that one is in the electric charge injection mode while the other is in the electric charge discharge mode in accordance with the value of information of the input optical signal carrying the selection direction information. Accordingly, the optical digital holding device which can switch the control at a high speed so that only one is exclusively controlled to the transmission state, and facilitates the cascade connection is provided.

According to the second type of the selector, the non-rotation and the 90 degrees rotation of the direction of polarization to the input light polarized in the specific direction in the first polarization plane rotation device are controlled in accordance with the value of the information of the input signal light carrying the selection direction signal to switch the ordinary/extraordinary light of the input light in the device to change the optical path, so that the light received in the second specified area is output from a light selection slit for the ordinary light and the light received in the second specified area is output from the light selection slit for the extraordinary light. Then, the direction of polarization of the output light is assured to be same as the direction of polarization of the input light by the second polarization plane rotation device. Accordingly, an optical digital holding apparatus which can select the output light at a high speed and facilitates cascade connection is provided.

According to the third type of the selector, since the light is selectively output by using the electro optical effect which reacts at a high speed to change the refractive index of the variable refractive index device, the optical digital holding apparatus which can select the output light at a high speed and facilitates cascade connection is provided.

The present invention will become more fully understood from the detailed description given hereinbelow and the accompanying drawings which are given by way of illustration only, and thus are not to be considered as limiting the present invention.

Further applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The embodiments of this invention will be explained hereunder with reference to the accompanying drawings. In the following embodiments, the same elements are represented by the same reference numerals, and a repetitive description of the same elements has been omitted. Further, all of the input/output signals of the apparatus in the following embodiments are optical signals. "0" represents absence of the optical signal, and "1" represents presence of the optical signal. In the following explanation of optical circuits, it is assumed that an optical branch unit and a light combination unit are placed at branch points of the signals and at junction points of the signals respectively and that mirrors or other devices are used to set the optical path, which is omitted from the drawings and explanation.

First Embodiment

An apparatus of this embodiment is a transparency latch (hereinafter called L latch) which outputs a logical value equal to a logical value of an input data signal when an input clock signal is "0", and holds and then outputs a logical value that is the logical value of the input data signal right before the input clock signal changes from "0" to "1" when the input clock signal is "1".

Figure 1:
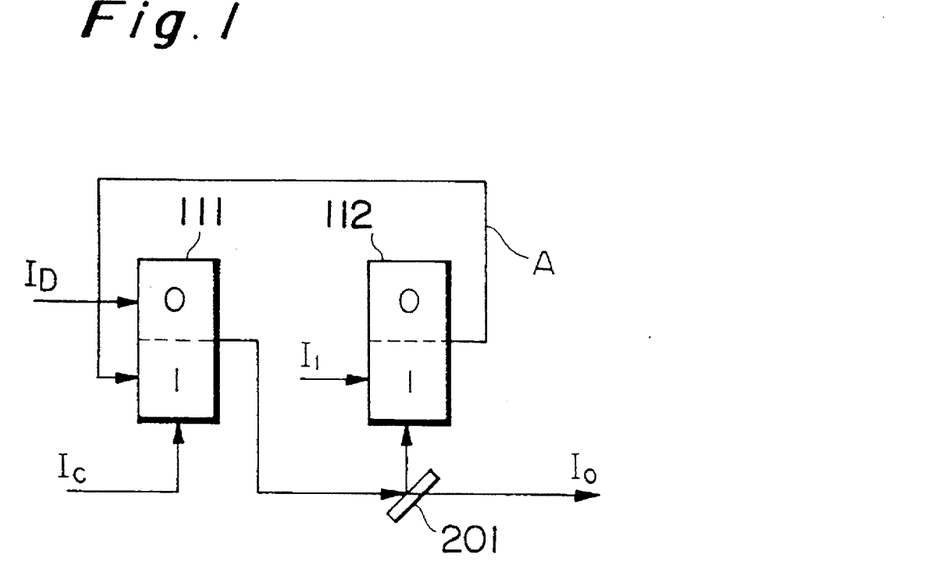
FIG. 1 shows a block diagram of an optical digital holding apparatus (L latch) according to the first embodiment of this invention.
Figure 2:
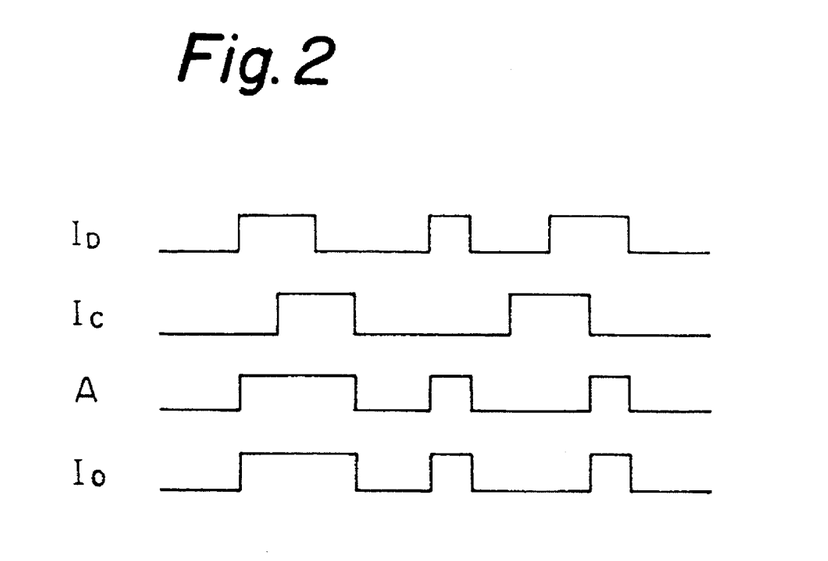
FIG. 2 shows an operation chart for the first embodiment of this invention.

FIG. 1 shows a block diagram of the apparatus of this embodiment. FIG. 2 shows an operation chart of this embodiment. The apparatus comprises a light source (not shown) for a predetermined value, an optical selector 111 for receiving an input data signal ($I_D$) at one input terminal thereof to be selected as an output (hereinafter called side "0" input terminal) when an light selection signal is "0" and inputting an input clock signal ($I_C$) at light selection signal terminal thereof, and an optical selection 112 with no light input applied to the side "0" input terminal and a constant light input ($I_1$) from the light source for a predetermined value applied to one of the input terminals thereof to be selected as the output (hereinafter called side "1" input terminal) when the light selection signal is "1". The output signal of the optical selector 111 is divided into two optical signals by a half-mirror 201. One of the divided signals is applied to the light selection signal terminal of the optical selector 112, and at the same time the other of the divided signals is the output optical signal of the apparatus. The output signal of the optical selector 112 is applied to the side "1" input terminal of the optical selector 111.

When the input clock signal is "0", the input signal applied to the side "0" input terminal, that is, the input data signal is selected to be the output of the optical selector 111 and outputted to the outside of the apparatus. Further, the input data signal is also applied to the light selection signal terminal of the optical selector 112, so that the output signal of the optical selector 112 is the signal having the same logical value as the input data signal. When the input clock signal changes from "0" to "1", the input signal applied to the side "1" input terminal, that is, the value of the input data signal right before the input clock signal changes to "1" is selected to be the output of the optical selection 111. This value is applied to the light selection signal terminal of the optical selector 112, so that the output of the optical selection 111 is maintained with this value, and the output optical signal is also maintained with this value. When the input clock signal goes to "0" again, the output optical signal is the same logical value as the input data signal as described above.

The operation of the optical selector involves both suitable signal delay and integration of signal waveform, so that oscillation in a feedback loop can be avoided.

Figure 3:
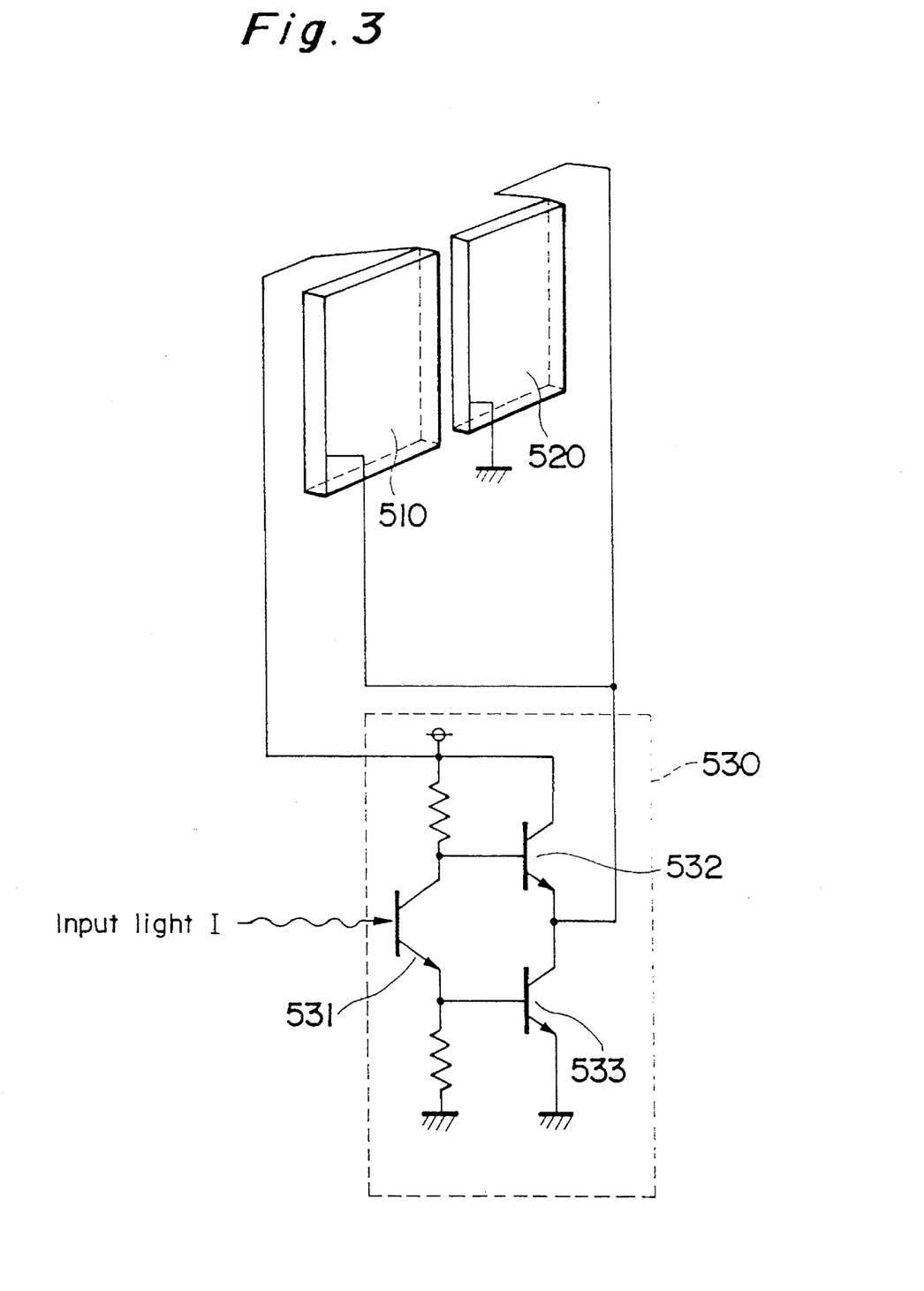
FIG. 3 shows a block diagram of an optical selector.

FIG. 3 shows the first block diagram of the optical selector for selectively outputting light received in a specified area, which is required to form such an optical digital holding apparatus and can be cascade-connected. This apparatus comprises variable transmittance devices 510 and 520 having either a quantum confined Stark effect or a Wannier-Stark localization effect, and a transmittance control circuit 530 electrically connected to those devices as shown in FIG. 3. The transmittance control circuit 530 comprises a phototransistor 531 for receiving an input light I, transistors 532 and 533 and resistors connected as shown in FIG. 3.

When the input light I is not applied, the transistor 532 is conductive and the transistor 533 is non-conductive and a voltage is applied to only the variable transmittance device 520, which does not substantially transmit light because an electric field is established therein. Since no electric field is established in the variable transmittance device 510, it transmits light at substantially full transmission. On the other hand, when the input light I is applied, the transistor 532 is non-conductive and the transistor 533 is conductive, so that the voltage is applied to only the variable transmittance device 510 which does not substantially transmit light because an electric field is established therein. Since no electric field is established in the variable transmittance device 520, substantially all light is transmitted therethrough. In this manner, an optical digital selector is formed which can be cascade-connected and which selectively outputs light received in a specified area. In switching the light receiving area of the light to be transmitted, the transistor 532 is provided for the variable transmittance device 510 and the transistor 533 is provided for the variable transmittance device 520 for discharging the electric charges accumulated in the device to which the voltage has been applied before switching. Accordingly, high speed switching of the transmittance is attained. While the variable transmittance device is used in the present apparatus, a variable reflectance device may be used.

Figure 4:
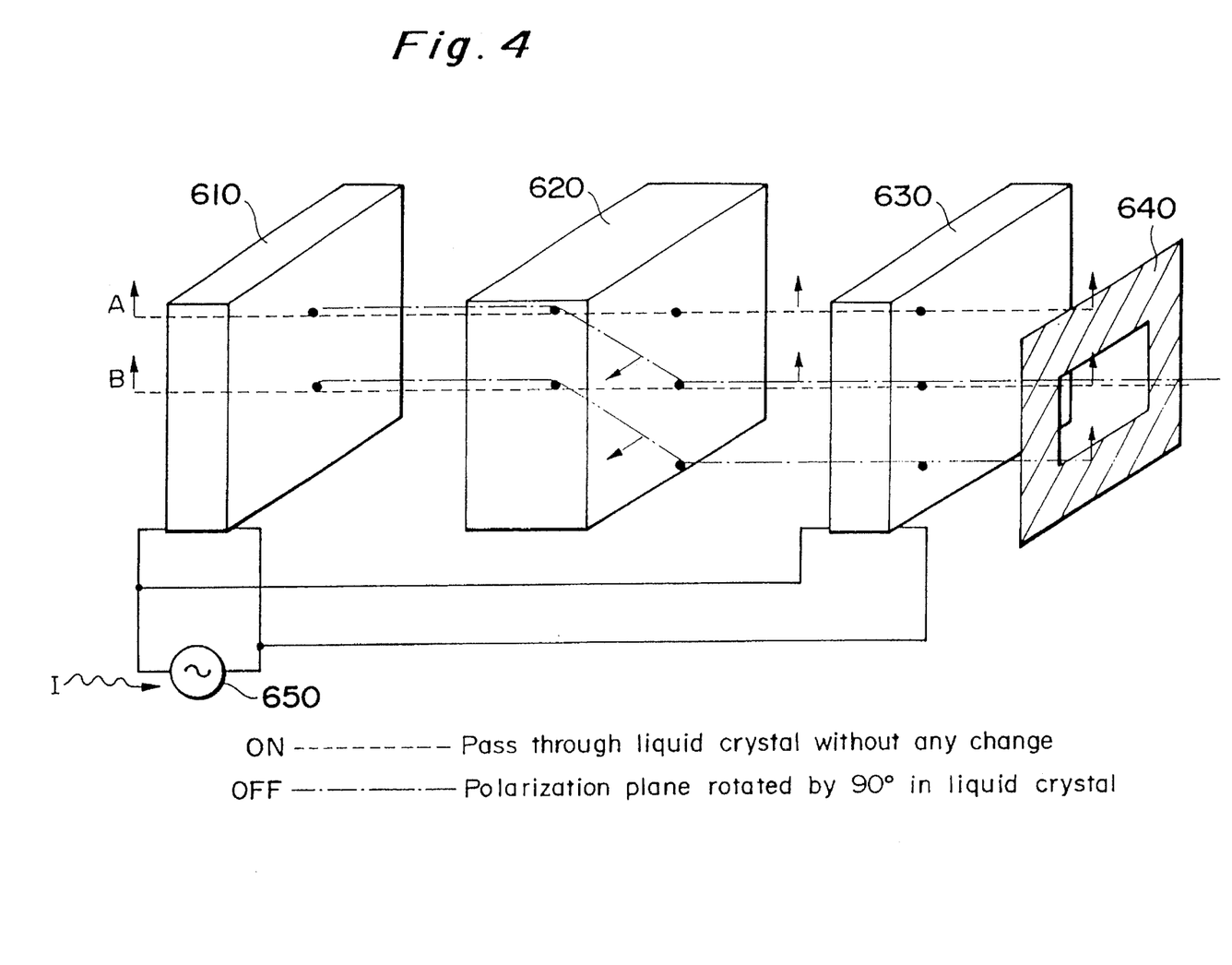
FIG. 4 shows a block diagram of an optical selector.

FIG. 4 shows the second block diagram of the optical selector. This apparatus includes a first polarization plane rotation device 610 made of a 90 degree TN liquid crystal, a device 620 made of calcite for receiving light output from the first polarization plane rotation device 610, a second polarization plane rotation device 630 made of a 90 degree TN liquid crystal which receives light output from the device 620, a light selection slit 640 which transmits a portion of the light output from the second polarization plane rotation device 630, and a deflection controller 650 which controls the first and second polarization plane rotation devices 610 and 630 to a non-rotation mode or a 90 degree rotation mode of the direction of polarization to the input light. The deflection controller 650 is in a ON state when the input light I is not applied, and in OFF state when the input light I is applied to rotate the polarization plane by 90 degrees.

In this apparatus, it is assumed that linearly polarized light A and B are applied. When the deflection controller 650 does not receive input light I, the deflection controller 650 is in the ON state so that the first and second polarization plane rotation devices 610 and 630 are in the non-rotation mode. In this case, the linearly polarized input light A and B are applied to the device 620 without any change in polarization so that ordinary light is applied to the device 620 and it goes straight and passes through the device 620. As a result, only the light B is transmitted through the second polarization plane rotation device passes through the light selection slit and it is output as shown.

When the deflection controller 650 receives the input light I, the deflection controller 650 is in the OFF state and the first and second polarization plane rotation devices 610 and 630 are in the 90 degree rotation mode. In this case, since the linearly polarized input light A and B have their planes of polarization changed before arriving at the device 620, they are extraordinary rays to the device 620 with the modified optical path. As a result, only the light A is transmitted through the second polarization plane rotation device, has its polarization direction returned to the original direction, passes through the light selection slit and it is output as shown.

It is noted that the optical selectors with the above-described construction are used in the following embodiments.

Second Embodiment

An apparatus of this embodiment is a transparency latch (hereinafter called H latch) which outputs a logical value equal to a logical value of an input data signal when an input clock signal is "1", and holds and then outputs a logical value that is the logical value of the input data signal right before the input clock signal changes from "1" to "0" when the input clock signal is "0".

Figure 5:
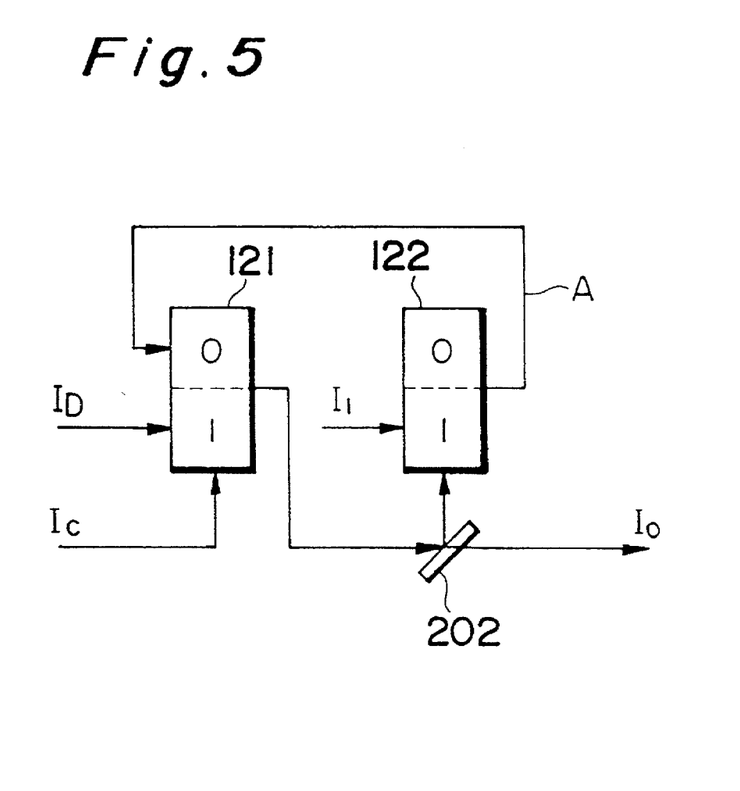
FIG. 5 shows a block diagram of an optical digital holding apparatus (H latch) according to the second embodiment of this invention.
Figure 6:
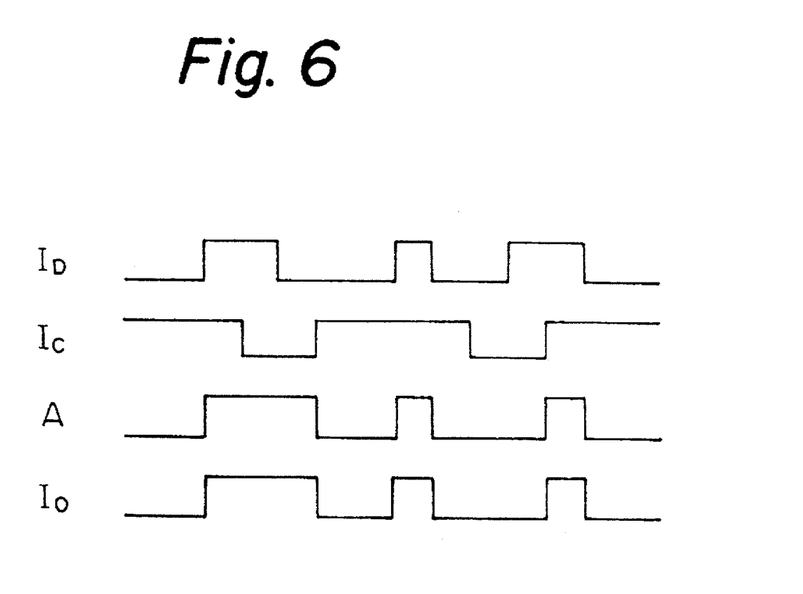
FIG. 6 shows an operation chart for the second embodiment of this invention.

FIG. 5 shows a block diagram of the apparatus of this embodiment. FIG. 6 shows an operation chart of this embodiment. The apparatus comprises a light source (not shown) for a predetermined value, an optical selector 121 for receiving an input data signal ($I_D$) at a side input terminal thereof and inputting an input clock signal ($I_C$) at a light selection signal terminal thereof, and an optical selector 122 with no light input applied to the side "0" input terminal and a constant light input ($I_1$) from the light source for a predetermined value applied to a side "1" input terminal thereof. The output signal of the optical selector 121 is divided into two optical signals by a half-mirror 202. One of the divided signals is applied to the light selection signal terminal of the optical selector 122, and at the same time the other of the divided signals is the output optical signal of the apparatus. The output signal of the optical selector 122 is applied to the side input terminal of the optical selector 121.

When the input clock signal is "1", the input signal applied to the side "1" input terminal, that is, the input data signal is selected to be the output of the optical selector 121 and output to the outside of the apparatus. Further, the input data signal is also applied to the light selection signal terminal of the optical selector 122, so that the output signal of the optical selector 122 is the signal having the same logical value as the input data signal. When the input clock signal changes from "1" to "0", the input signal applied to the side "0" input terminal, that is, the value of the input data signal just before the input clock signal changes to "0" is selected to be the output of the optical selector 121. This value is applied to the light selection signal terminal of the optical selector 122, so that the output of the optical selector 121 is maintained with this value and the output optical signal is also maintained with this value. When the input clock signal goes to "1" again, the optical signal output is the same logical value as the input data signal as described above.

Similar to the first embodiment, the operation of the optical selector involves both suitable signal delay and integration of signal waveform, so that oscillation in a feedback loop can be avoided.

Third Embodiment

An apparatus of this embodiment is what is called an edge trigger latch which holds an then outputs a logical value of an input data signal when an input clock signal rises from "0" to "1".

Figure 7:
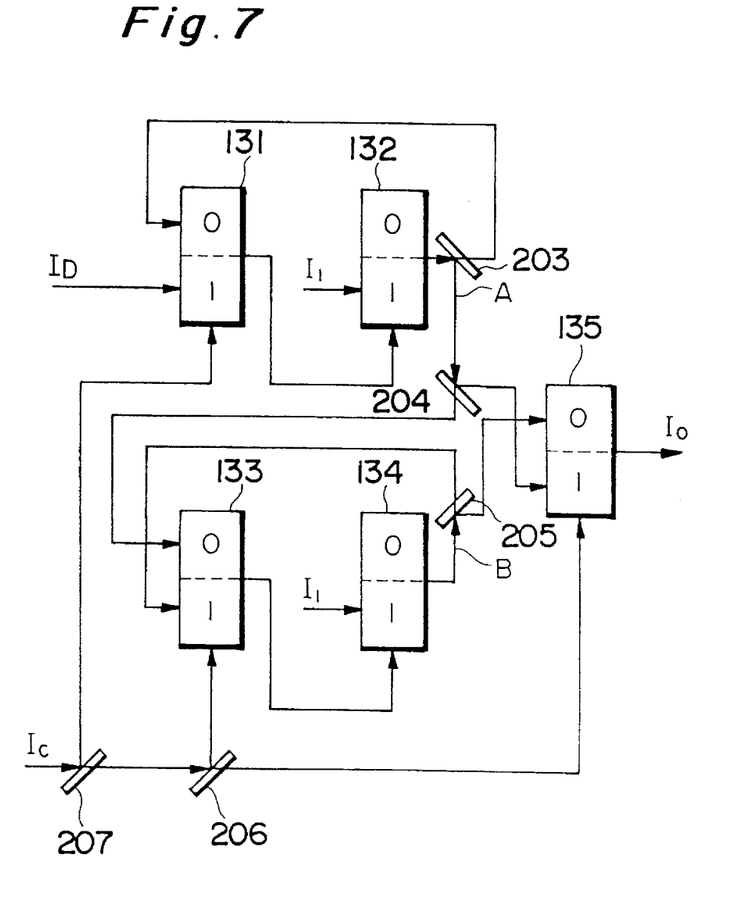
FIG. 7 shows a block diagram of an optical digital holding apparatus (edge trigger latch) according to the third embodiment of this invention.
Figure 8:
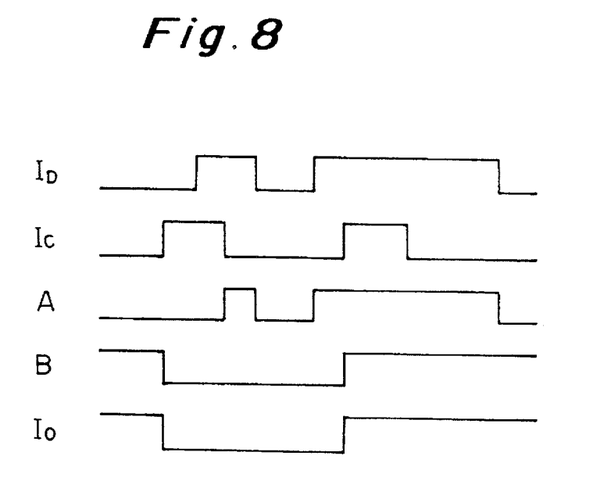
FIG. 8 shows an operation chart for the third embodiment of this invention.

FIG. 7 shows a block diagram of the apparatus of this embodiment. FIG. 8 shows an operation chart of this embodiment. The apparatus is formed so that an H-latch unit described in the above embodiment is connected with an L-latch unit also described above in series and either a feedback signal in the H-latch unit or a feedback signal in the L-latch unit is selected to be an output of the apparatus.

The H-latch unit comprises a light source (not shown) for a predetermined value, an optical selector 131 for receiving an input data signal ($I_D$) at a side input terminal and inputting an optical signal divided by a half-mirror 207 at an light selection signal terminal, and an optical selector 132 with no light input applied to a side "0" input terminal thereof and constant light input ($I_1$) from the light source for a predetermined value applied to the side "1" input terminal thereof. The output signal of the optical selector 131 is applied to the light selection signal terminal of the optical selector 132. The output signal of the optical selector 132 is divided into two optical signals by a half-mirror 203. One of the signals divided by the half-mirror 203 is applied to the side "0" input terminal of the optical selector 131.

The L-latch unit comprises a light source (not shown) for a predetermined value, an optical selector 133 for receiving one of the signals divided by a half-mirror 204 at the side "0" input terminal thereof and inputting one of signals divided by a half-mirror 206 at a light selection signal terminal thereof, an optical selector 134 with no light input applied to the side "0" input terminal and a constant light input ($I_1$) from the light source for a predetermined value applied to a "1" side input terminal thereof. The output signal of the optical selector 133 is applied to the light selection signal terminal of the optical selector 134. The output signal of the optical selector 134 is divided into two signals by a half-mirror 205. One of the signals divided by the half-mirror 205 is applied to the side input terminal of the optical selector 133.

The other of the signals divided by the half-mirror 204 is applied to the side "1" input terminal of the optical selector 135 and the other of the signals divided by the half-mirror 205 is applied to the side "0" input terminal of the optical selector 135. The other of the two signals divided by the half-mirror 206 is applied to the light selection signal terminal of the optical selector 135. The output of the optical selector 135 is an output optical signal ($I_O$).

When the input clock signal is "0", the H-latch unit outputs the same logical value as the input data signal to the L-latch unit and the side "1" input terminal of the optical selector 135 at the same time. At this time, the L-latch unit outputs the signal having the logical value held therein to the side "0" input terminal of the optical selector 135. The optical selector 135 selects the input signal applied to the side "0" input terminal as the output, that is, the L-latch unit selects the signal having the logical value held therein as the output.

Next, when the input clock signal changes from "0" to "1", the H-latch unit holds and then outputs the value of the input data signal right before this change. The L-latch unit outputs the same logical value as the output of the H-latch unit. As a result, the optical selector 135 selectively outputs the input signal from the H-latch unit.

Next, when the input clock signal changes from "1" to "0", the H-latch unit outputs the signal having the same logical value as the input data signal to the L-latch unit and the side "1" input terminal of the optical selector 135. The L-latch unit holds and then outputs the output signal of the H-latch unit just before the input clock signal changes, that is, the logical value held by the H-latch unit when the input clock signal changes from "0" to "1". The optical selector 135 selects the input signal applied to the side "0" input terminal to be the output, that is, the L-latch unit selects a signal having the logical value held therein.

Accordingly, this apparatus achieves the function of the edge trigger latch that is holding and then outputting the logical value of the input data signal when the input clock signal rises from "0" to "1".

Similar to the first embodiment, the operation of the optical selector involves both suitable signal delay and integration of signal waveform, so that oscillation in a feedback loop can be avoided.

Fourth Embodiment

An apparatus of this embodiment is an RS flip-flop which outputs an output signal "1" when an input set signal is "1" and outputs an output signal "0" when an input reset signal is "1".

Figure 9:
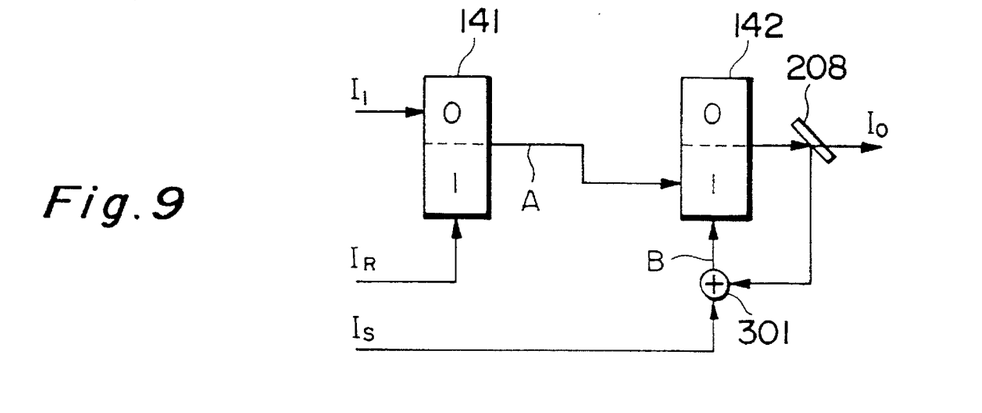
FIG. 9 shows a block diagram of an optical digital holding apparatus (RS flip-flop) according to the fourth embodiment of this invention.
Figure 10:
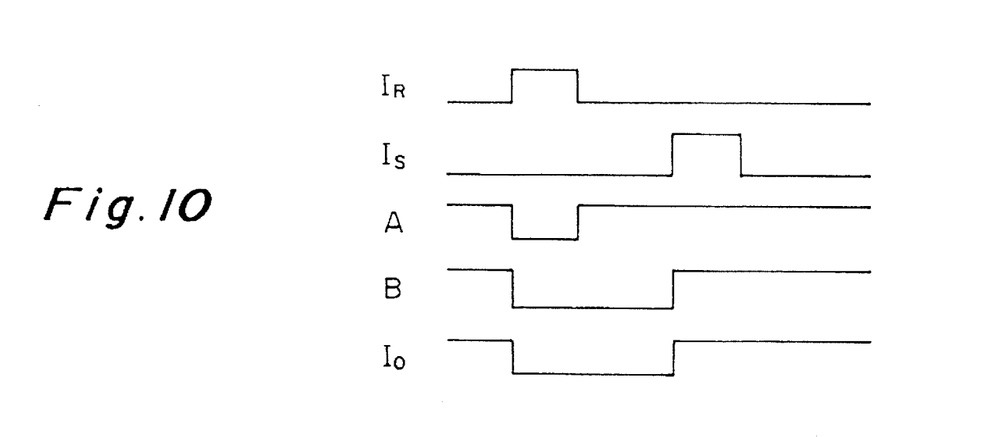
FIG. 10 shows an operation chart for the fourth embodiment of this invention.

FIG. 9 shows a block diagram of this embodiment. FIG. 10 shows an operation chart of this embodiment. This apparatus comprises a light source (not shown) for a predetermined value, an optical selector 141 for receiving an input data signal ($I_D$) as an optical input ($I_1$) at a side "1"

input terminal thereof and inputting a reset signal ($I_R$) at an light selection signal terminal thereof, and an optical selector 142 for inputting an output signal of an optical adder 301, which add the set signal ($I_S$) and one of the signals divided by a half-mirror 208, at a light selection signal terminal and inputting an output signal of the optical selector 141 at a side "1" input terminal with no light input applied to the side "0" input terminal. The output optical signal is the other of signals divided by a half-mirror 208.

As the set signal becomes "1" while the reset signal has been "0", the output of the optical selector 141 is "0" and the output optical signal is always "0". As a result, the input to the light selection signal terminal of the optical selector 142 becomes "0".

Next, as the reset signal becomes "1" while the reset signal has been "1", the output of the optical selector 141 is "1" and the input to the light selection signal terminal of the selector 142 is "1", so that the output optical signal becomes "1" and the input to the light selection signal terminal of the optical selector 142 is maintained with "1".

Accordingly, this apparatus achieves the function of the RS flip-flop which when the set signal is "1", the output is "0", and when the reset signal is "1", the output is "0" and when the set signal and reset signal are both "0", the output is the data previously held.

Similar to the first embodiment, the operation of the optical selector involves both suitable signal delay and integration of signal waveform, so that oscillation in a feedback loop can be avoided.

Figure 11:
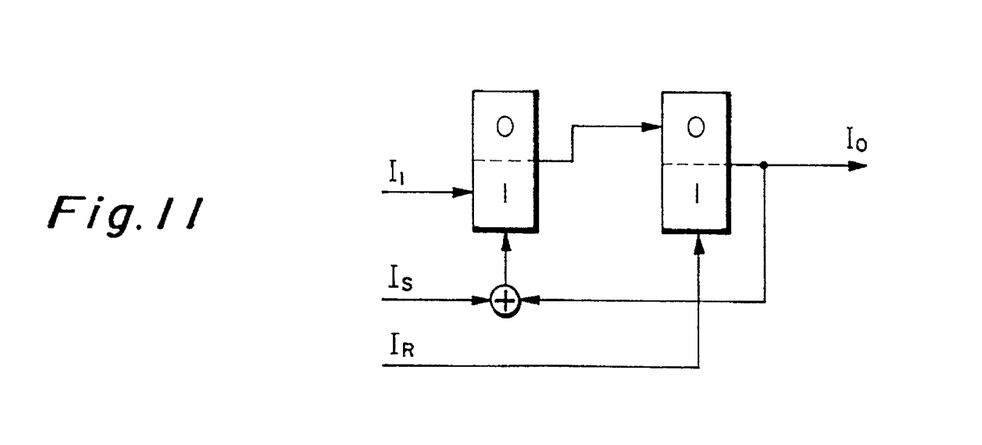
FIG. 11 shows a block diagram of another RS flip-flop.
Figure 12:
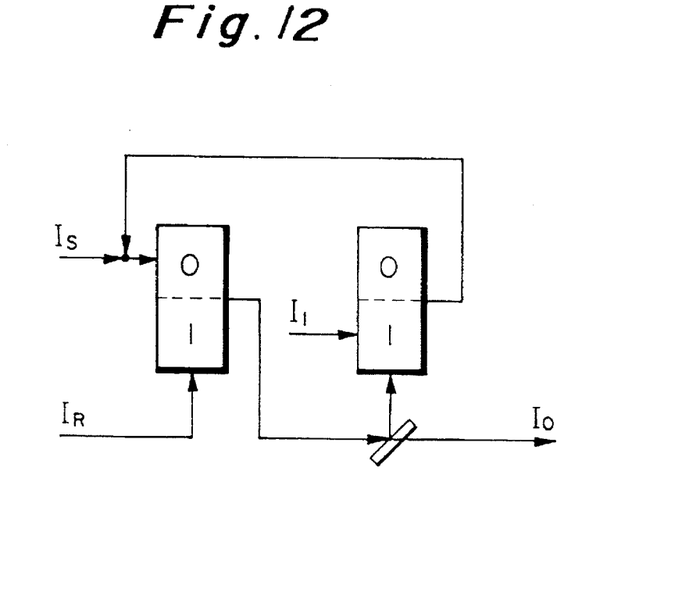
FIG. 12 shows a block diagram of another RS flip-flop.
Figure 13:
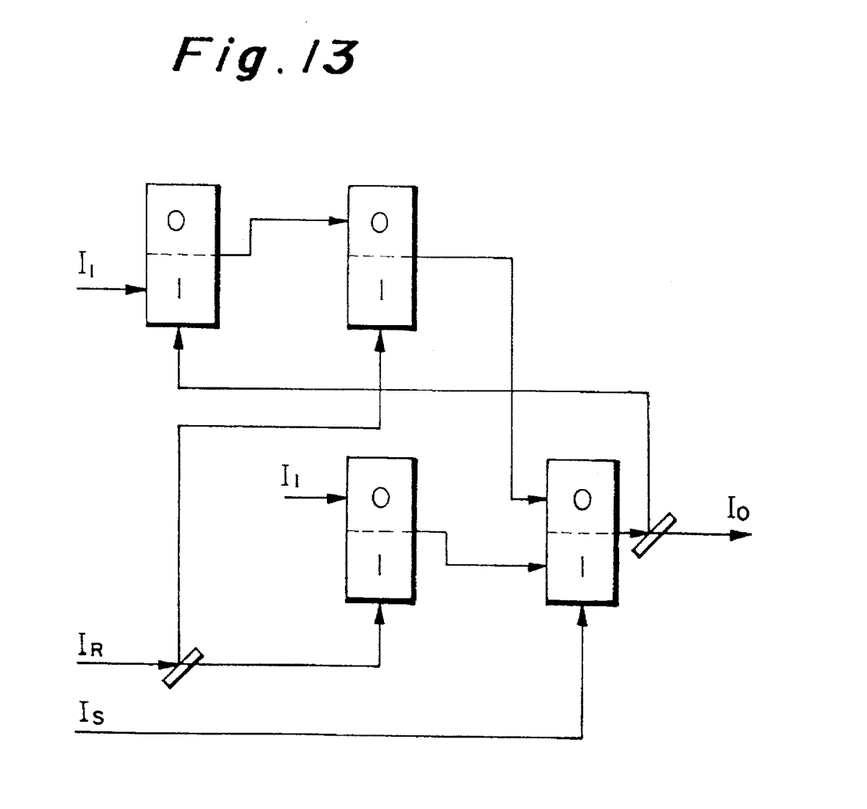
FIG. 13 shows a block diagram of another RS flip-flop.

Further, when the optical circuit is constructed as shown in FIG. 11–FIG. 13, the RS flip-flop which can operate in the same manner as the embodiments is obtained.

The optical feedback circuit formation and the optical path setting for the optical logical connection is provided by edging a glass plate. In this way, a large scale circuit can be formed at the same time. Further, if a silicon substrate or a GaAs substrate is used to select a transmission wavelength, a current edging technique can be used, and at the same time devices to which quantum confined Stark effect or a Wannier-Stark localization effect is applied can be manufactured.

The present invention is not limited to the embodiments as described above but various modification thereof may be made. For example, the optical selector may comprise (1) a variable refractive index device for receiving an optical data signal and electrically changing a refractive index, (2) a refractive index controller for receiving a light selection signal carrying binary digital information, and changing a refractive index of said variable refractive index device in accordance with the value of information carried by the light selection signal, and (3) a light selection slit for transmitting only a light output from a specified position of the variable refractive index device, and selectively outputting a light input to a specified area of the variable refractive index device in accordance with a value of information carried by the light selection signal. Further, in the embodiments, the simple 1 bit latch and 1 bit flip-flop are mentioned, but combining these, a multi-bit optical digital holding device may be used.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. An optical digital holding apparatus comprising:

a set of selectors, each for receiving an aggregation of spatially distributed optical digital information signals propagating in a predetermined direction and bearing binary digital information, for receiving an optical control signal carrying binary digital information, and for selectively outputting a portion of the aggregation of the spatially distributed optical digital information signals received in accordance with a value of the digital information carried by the optical control signal, wherein said selectors are placed in multistage; and optical connections for providing predetermined interconnection of said selectors with each other, including an optical feedback path for connecting an output optical signal of one of said selectors as an input optical signal of one of the other selectors and connecting an output optical signal of said one of the other selectors as an input optical signal of a selector in a stage preceding that of said one of the other selectors.

2. An optical digital holding apparatus according to claim 1, wherein said optical feedback path connects an output optical signal of said one of the other selectors as an input optical digital information signal of a selector in a stage preceding that of said one of the other selectors.

3. An optical digital holding apparatus according to claim 1, wherein said feedback optical path connects an output optical signal of said one of the other selectors as an input optical control signal of a selector in a stage preceding that of said one of the other selectors.

4. An optical digital holding apparatus according to claim 1, wherein the number of said optical digital information signals input to each of said selectors is two;

the number of said optical control signals input to each of said selectors is one; and each of said selectors outputs a third optical information signal bearing the binary digital information borne by one of a first optical information signal received in a first area and a second optical information signal received in a second area in accordance with a value of the binary digital information borne by the optical control information.

5. An optical digital holding apparatus according to claim 4, wherein each of said selectors comprises:

a first variable transmittance device and a second variable transmittance device driven independently for controlling the transmission of an input light;

a first electric charge injecting means for injecting electric charge into said first variable transmittance device;

a first electric charge discharging means for discharging electric charge from said first variable transmittance device;

a second electric charge injecting means for injecting electric charge into said second variable transmittance device;

a second electric charge discharging means for discharging electric charge from said second variable transmittance device; and an optical detection circuit for issuing an activation signal to one of the pairs comprising i) said first electric charge injecting means and said second electric charge discharging means, and ii) said second electric charge injecting means and said first electric charge discharging means, and for issuing a deactivation signal to the other of said pairs in accordance with the value of the information borne by the input optical control signal.

6. An optical digital holding apparatus according to claim 5, wherein said variable transmittance devices are self-electro-optic effect devices and which have one of a quantum confined Stark effect and a Wannier-Stark localization effect.

7. An optical digital holding apparatus according to claim 4, wherein each of said selectors comprises:

a first variable reflectance device and a second variable reflectance device driven independently for controlling the reflection of an input light;

a first electric charge injecting means for injecting electric charge into said first variable reflectance device;

a first electric charge discharging means for discharging electric charge from said first variable reflectance device;

a second electric charge injecting means for injecting electric charge into said second variable reflectance device;

a second electric charge discharging means for discharging electric charge from said second variable reflectance device; and an optical detection circuit for issuing an activation signal to one of the pairs comprising i) said first electric charge injecting means and said second electric charge discharging means, and ii) said second electric charge injecting means and said first electric charge discharging means, and issuing a deactivation signal to the other of said pairs in accordance with the value of the information borne by the input optical control signal.

8. An optical digital holding apparatus according to claim 7, wherein said variable reflectance devices are self-electro-optic effect devices and which have one of a quantum confined Stark effect and a Wannier-Stark localization effect.

9. An optical digital holding apparatus according to claim 4, wherein each of said selectors comprises:

a first polarization plane rotation device for selectively performing one of non-rotation and 90 degrees rotation of a polarization direction of an input linearly polarized light having a predetermined direction of polarization;

a birefringent plate for changing an optical path in accordance with the direction of polarization of the input linearly polarized light received through said first polarization plane rotation device;

a second polarization plane rotation device for selectively performing one of non-rotation and 90 degrees rotation of the polarization direction in the linearly polarized light output from said birefringent plate;

a polarization plane rotation controller for setting said first polarization plane rotation device and said second polarization plane rotation device into one of a non-rotation mode and a 90 degrees rotation mode in accordance with a value of the binary digital information carried by the optical control signal; and an output light selector for selecting only the light output from a predetermined area of said second polarization plane rotation device.

10. An optical digital apparatus according to claim 9, wherein said first and second polarization plane rotation devices include twisted nematic liquid crystal cells.

11. An optical digital holding apparatus according to claim 1, wherein each of said selectors comprises:

a variable refractive index device for electrically changing a refractive index;

a refractive index controller for receiving said optical control signal and changing a refractive index of said variable refractive index device in accordance with the value of information carried by the optical control signal; and a light selection slit for only transmitting light output from a specified position of said variable refractive index device;

whereby each of said selectors selectively outputs an optical digital information signal input to a specified area of said variable refractive index device in accordance with the value of information carried by said optical control signal.

12. An optical digital holding apparatus comprising:

a set of selectors, each for receiving an aggregation of spatially distributed optical digital information signals propagating in a predetermined direction and bearing binary digital information, for receiving an optical control signal bearing binary digital information, and for selectively outputting a portion of an aggregation of the digital information signals received in accordance with a value of the digital information borne by the optical control signal, wherein said selectors are placed in multistage; and optical connections for providing predetermined interconnection of said selectors with each other, including an optical feedback path for connecting an output optical signal of one of said selectors as an input optical signal of one of the other selectors.

13. An optical digital holding device according to claim 12, wherein said optical feedback path connects the output optical signal of said one of said selectors as an input optical digital information signal of said one of the other selectors.

14. An optical digital holding device according to claim 12, wherein said feedback optical path connects the output optical signal of said one of said selectors as the optical control signal of said one of the other selectors.

15. An optical digital holding apparatus according to claim 12, wherein the number of said optical digital information signals inputting to each of said selectors is two;

the number of said optical control signal input to each of said selectors is one; and each of said selectors outputs a third optical information signal bearing the binary digital information borne by one of a first optical information signal received in a first area and a second optical information signal received in a second area in accordance with a value of the binary digital information borne by the optical control information.

16. An optical digital holding apparatus according to claim 15, wherein each of said selectors comprises:

a first variable transmittance device and a second variable transmittance device driven independently for controlling the transmission of an input light;

a first electric charge injecting means for injecting electric charge into said first variable transmittance device;

a first electric charge discharging means for discharging electric charge from said first variable transmittance device;

a second electric charge injecting means for injecting electric charge into said second variable transmittance device;

a second electric charge discharging means for discharging electric charge from said second variable transmittance device; and an optical detection circuit for issuing an activation signal to one of the pairs comprising i) said first electric charge injecting means and said second electric charge discharging means, and ii) said second electric charge injecting means and said first electric charge discharging means, and issuing a deactivation signal to the other of said pairs in accordance with a value of the binary digital information borne by the input optical control signal.

17. An optical digital holding apparatus according to claim 16, wherein said variable transmittance devices are self-electro-optic effect devices and which have one of a quantum confined Stark effect and a Wannier-Stark localization effect.

18. An optical digital holding apparatus according to claim 15, wherein each of said selectors comprises:

- a first variable reflectance device and a second variable reflectance device driven independently for controlling the refection of an input light;
- a first electric charge injecting means for injecting electric charge into said first variable reflectance device;
- a first electric charge discharging means for discharging electric charge from said first variable reflectance device;
- a second electric charge injecting means for injecting electric charge into said second variable reflectance device;
- a second electric charge discharging means for discharging electric charge from said second variable reflectance device; and
- an optical detection circuit for issuing an activation signal to one of the pairs comprising i) said first electric charge injecting means and said second electric charge discharging means, and ii) said second electric charge injecting means and said first electric charge discharging means, and issuing a deactivation signal to the other of said pairs in accordance with a value of the binary digital information borne by the input optical control signal.

19. An optical digital holding apparatus according to claim 18, wherein said variable transmittance devices are a self-electro-optic effect devices and which have one of a quantum confined Stark effect and a Wannier-Stark localization effect.

20. An optical digital holding apparatus according to claim 15, wherein each of said selector comprises:

- a first polarization plane rotation device for selectively performing one of non-rotation and 90 degrees rotation of a polarization direction of an input linearly polarized light having a predetermined direction of polarization;
- a birefringent plate for changing an optical path in accordance with the polarization direction in the input linearly polarized light received through said first polarization plane rotation device;
- a second polarization plane rotation device for selectively performing one of non-rotation and 90 degrees rotation of the polarization direction in the linearly polarized light output from said birefringent plate;
- a polarization plane rotation controller for setting said first polarization plane rotation device and said second polarization plane rotation device into one of a non-rotation mode and a 90 degrees rotation mode in accordance with a value of the binary digital information borne by the optical control signal; and
- an output light selector for selecting only the light output from a predetermined area of said second polarization plane rotation device.

21. An optical digital holding apparatus according to claim 20, wherein said first and second polarization plane rotation devices include twisted nematic liquid crystal cells.

22. An optical digital holding apparatus according to claim 12, wherein each of said selectors comprises:

- a variable refractive index device for electrically changing a refractive index;
- a refractive index controller for receiving said optical control signal and changing a refractive index of said variable refractive index device in accordance with a value of information carried by the optical control signal; and
- a light selection slit for transmitting only light output from a specified position of said variable refractive index device;
- whereby each of said selectors selectively outputs an optical digital information signal input to a specified area of said variable refractive index device in accordance with a value of information carried by said optical control signal.

* * * * *